United States Patent
Wang

(10) Patent No.: US 10,424,532 B2
(45) Date of Patent: Sep. 24, 2019

(54) COOLANT CONTACT TYPE COOLING SYSTEM FOR HIGH-POWER DEVICE AND OPERATION METHOD THEREOF

(71) Applicant: GUANGDONG HI-1 NEW MATERIALS TECHNOLOGY RESEARCH INSTITUTE CO. LTD, Guangzhou (CN)

(72) Inventor: Wei Wang, Guangzhou (CN)

(73) Assignee: GUANGDONG HI-1 NEW MATERIALS TECHNOLOGY RESEARCH INSTITUTE CO LTD, Guangzhou (CN)

(*) Notice: Subject to any disclaimer, the term of this patent is extended or adjusted under 35 U.S.C. 154(b) by 0 days.

(21) Appl. No.: 16/076,331

(22) PCT Filed: Oct. 20, 2016

(86) PCT No.: PCT/CN2016/102650
§ 371 (c)(1),
(2) Date: Aug. 8, 2018

(87) PCT Pub. No.: WO2017/215168
PCT Pub. Date: Dec. 21, 2017

(65) Prior Publication Data
US 2019/0043785 A1    Feb. 7, 2019

(30) Foreign Application Priority Data
Jun. 16, 2016  (CN) .......................... 2016 1 0439360

(51) Int. Cl.
*H01L 23/42*  (2006.01)
*H01L 23/473*  (2006.01)
(Continued)

(52) U.S. Cl.
CPC .......... *H01L 23/473* (2013.01); *H01L 23/427* (2013.01); *H01L 23/44* (2013.01);
(Continued)

(58) Field of Classification Search
CPC .............. H01L 23/473; H05K 7/20218; H05K 7/20272; H05K 7/20281
See application file for complete search history.

(56) References Cited

U.S. PATENT DOCUMENTS

| 8,194,406 B2 * | 6/2012 | Campbell .............. H05K 7/203 361/698 |
| 2006/0174642 A1 * | 8/2006 | Nagashima ............. F28D 15/00 62/259.2 |
| 2017/0084514 A1 * | 3/2017 | Kumari ................. H01L 23/427 |

FOREIGN PATENT DOCUMENTS

| CN | 102573385 A | 7/2012 |
| CN | 203279429 U | 11/2013 |

(Continued)

*Primary Examiner* — Nicholas J Tobergte
(74) *Attorney, Agent, or Firm* — Gokalp Bayramoglu

(57) ABSTRACT

Disclosed is a working contact cooling system for a high-power device (1), wherein the sealed case body (8) is a structure having inner and outer layers, a chamber between the inner and outer layers is filled with a heat-superconductive coolant (9), and an outer wall of the outer layer of the sealed case body (8) is provided with heat dissipating fins (10); the sealed case body (8) is provided with an insulating liquid heat-conductive coolant (2), the coolant pump (6) sinks in the insulating liquid heat-conductive coolant (2), the filter (7) is installed at an inlet of the coolant pump (6), the coolant pump (6) is connected to the spray main pipe (5), and a plurality of spray branch pipes (4) are connected in parallel with the spray main pipe (5), each of the spray branch pipes (4) is provided with a plurality of nozzles (3),
(Continued)

and the nozzles (3) face the high-power device (1); the nozzles (3) spray against front and back surfaces of the high-power device (1).

6 Claims, 1 Drawing Sheet

(51) Int. Cl.
*H05K 7/20* (2006.01)
*H01L 23/427* (2006.01)
*H01L 23/44* (2006.01)

(52) U.S. Cl.
CPC ....... *H01L 23/4735* (2013.01); *H05K 7/2029* (2013.01); *H05K 7/20218* (2013.01); *H05K 7/20236* (2013.01); *H05K 7/20345* (2013.01); *H05K 7/20927* (2013.01); *H05K 7/20272* (2013.01); *H05K 7/20281* (2013.01)

(56) References Cited

FOREIGN PATENT DOCUMENTS

| | | |
|---|---|---|
| CN | 203618277 U | 5/2014 |
| CN | 105934138 A | 9/2016 |
| CN | 105934139 A | 9/2016 |
| CN | 105934140 A | 9/2016 |
| CN | 105960148 A | 9/2016 |
| CN | 105977572 A | 9/2016 |
| CN | 205847818 U | 12/2016 |

\* cited by examiner

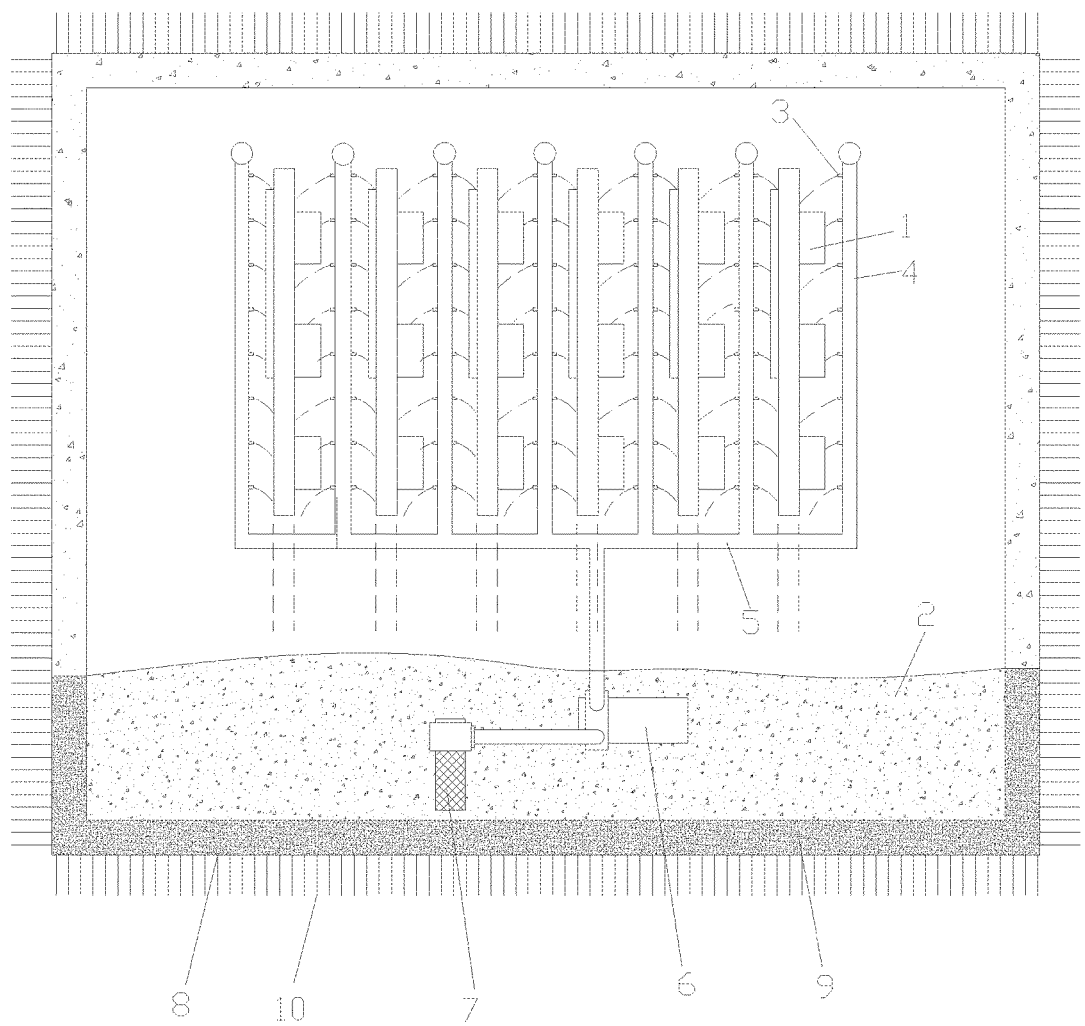

COOLANT CONTACT TYPE COOLING SYSTEM FOR HIGH-POWER DEVICE AND OPERATION METHOD THEREOF

CROSS REFERENCE TO RELATED APPLICATIONS

This application is the national phase entry of International Application PCT/CN2016/102650, filed on Oct. 20, 2016, which is based upon and claims priority to Chinese Patent Application No. 201610439360.0, filed on Jun. 16, 2016, the entire contents of which are incorporated herein by reference.

TECHNICAL FIELD

The invention relates to the technical field of cooling of high-power devices, in particular to a coolant contact type cooling system for a high-power device and an operation method thereof.

BACKGROUND

With the implementation of the new energy strategy, electric vehicles are being widely used. Lithium-ion batteries are well applied for their excellent power output characteristics and long service life. However, the performance of high-capacity, high-power lithium-ion batteries are sensitive to temperature changes. The space is limited, the number of batteries is large and they are closely arranged and connected. When the vehicle is running under different driving conditions, the batteries will discharge at different rates, generate a qlarge amount of heat at different heat generation rates, considering accumulation of time and influence of limited space, uneven heat accumulation will occur, resulting in complex and variable battery operating environment temperature. If this situation lasts for a long time, overcharge and overdischarge of some batteries would occur, which will affect the life and performance of the batteries and cause safety hazards.

With the miniaturization and micro-miniaturization of electronic components as well as the high integration and micro-assembly of integrated circuits, the heat flux density of devices and components is constantly increasing, and thermal design thereof is facing severe challenges. Heat dissipation problems are present in the technical field such as radiation transmitters, high-power electronic devices, chips, data room equipment, high-power power supplies, IGBTs, transformers and the like.

High-power devices such as electronic power modules, battery power supplies, and electronic chips generate heat during operation that must be carried away by the cooling device to prevent the temperatures from exceeding their safe working limits. The current high-power heat dissipation structure has the following technical defects:

1. Since the electronic device needs insulation protection, the cooling coolant used in the current cooling device is in indirect contact with the heat sink member. Heat-conductive silicone grease, heat-conductive oil, the metallic heat sinks (for receiving heat), etc. are necessary as the intermedium for heat transfer, and mostly forced air cooling is used for the heat dissipation. The conventional heat-dissipating cooling device increases the thermal resistance due to the presence of the intermedium. If the heat cannot be dissipated in time, it is easy to cause high-power heat accumulation, which causes the junction temperature of the electronic device to rise and thus causes damage.

2. When air forced convection cooling is used, the heat conductivity of air is much lower than that of liquid, and it is necessary to install a power consumption device such as a fan to achieve forced convection of ambient air. The technology indirectly cools the heat generation body by cooling the environment space where the electronic device is located, and the heat exchange conditions and the heat exchange efficiency are limited. Also, the forced convection device such as the fan consumes a part of the electric power, and the power consumption increases as the heat dissipation power increases.

3. Due to the forced convection circulation of air, the environment in which the electronic device is located requires for high air cleanliness.

SUMMARY

In order to solve the above technical problems, the present invention provides a coolant contact type cooling system for a high-power device, which has reasonable heat dissipation structure and effective heat dissipation.

The invention also provides an operation method of a coolant contact type cooling system for a high-power device.

The technical solution of the present invention to solve the above technical problems is as follows:

A coolant contact type cooling system of a high-power device, where it comprises a high-power device, an insulating liquid heat-conductive coolant, nozzles, spray branch pipes, a spray main pipe, a coolant pump, a filter and a sealed case body.

The sealed case body is a structure having inner and outer layers, a chamber between the inner and outer layers is filled with a heat-superconductive coolant, and an outer wall of the outer layer of the sealed case body is provided with heat dissipating fins.

The sealed case body is provided with an insulating liquid heat-conductive coolant, the coolant pump sinks in the insulating liquid heat-conductive coolant, the filter is installed at an inlet of the coolant pump, the coolant pump is connected to the spray main pipe, and a plurality of spray branch pipes are connected in parallel with the spray main pipe, each of the spray branch pipes is provided with a plurality of nozzles, and the nozzles face the high-power device.

The nozzles spray against front and back surfaces of the high-power device to form a relatively open spray structure; the insulating liquid heat-conductive coolant is a non-polar substance, and the insulating liquid heat-conductive coolant has no phase change during the spraying process.

The spray branch pipes and the high-power device are arranged and spaced apart in parallel in a longitudinal direction.

The insulating liquid heat-conductive coolant is transformer oil, heat transfer oil or mineral oil.

The heat-superconductive coolant is Freon, ammonia, alcohol, acetone, water or a dowtherm heat-exchanging agent.

The high-power device may be an electric vehicle power battery, an electronic chip, a radar transmitter, a data room equipment, a high-power source, IGBT, IGCT, IEGT, a CPU component, a GPU component, a blade server module or a transformer.

An operation method of a coolant contact type cooling system for a high-power device as stated above, where the coolant pump is started, the insulating liquid heat-conductive coolant passes through the filter into the coolant pump, the coolant pump delivers the insulating liquid heat-conductive coolant to the spray main pipe, the spray main pipe distributes the insulating liquid heat-conductive coolant to each of the spray branch pipes, the insulating liquid heat-conductive coolant sprayed from the nozzles is directly sprayed to the front and back surfaces of the high-power device, heat of the high-power device is carried away by the insulating liquid heat-conductive coolant, and the insulating liquid heat-conductive coolant returns to the sealed case body under an action of gravity.

The insulating liquid heat-conductive coolant exchanges heat with the heat-superconductive coolant, and the heat-superconductive coolant exchanges heat with the heat dissipating fins, and in this cycle, heat of the high-power device is continuously carried away by the insulating liquid heat-conductive coolant.

The present invention has the following advantages over the prior art:

1. The nozzle sprays against the front and back surfaces of the high-power device to form a relatively open spray structure. The insulating liquid heat-conductive coolant directly contacts the heat-generating surface of the high-power device that needs to dissipate heat, which reduces the contact thermal resistance. There is no intermedium and heat transfer and conversion process, which improve heat transfer efficiency.

2. The spray branch pipes and the high-power device are arranged and spaced apart in parallel in the longitudinal direction, which leads to large spray area and high heat exchange efficiency.

3. Insulating liquid heat-conductive coolant is non-polar substance. During the spraying process, the insulating liquid heat-conductive coolant has no phase change. The sprayed insulating liquid heat-conductive coolant forms an atomized liquid film on the surface of the high-power device, and the atomized liquid film heat conduction has excellent properties regarding heat transfer and flow such as small flow rate, large temperature difference, high heat transfer coefficient and high heat flux density.

4. Under the same ambient temperature, temperature difference of direct contact cooling heat dissipation can be controlled. Compared with the non-direct contact heat transfer mode, the surface temperature of the high-power device can be further reduced, which helps to improve the service life and reliability of the high-power device.

5. By using spray-type heat dissipation, the effective contact area (heat exchange area) of the insulating liquid heat-conductive coolant and the high-power device heating surface are increased, so the theoretical heat transfer efficiency will increase (the heat exchange amount is proportional to the area), which further improves the effective utilization rate of the insulating liquid heat-conductive coolant.

6. The secondary heat conduction cycle adopts heat-superconductive technology, which has fast heat conduction speed, high heat flux density and good heat transfer uniformity. The insulating liquid heat-conductive coolant can be quickly and effectively cooled, and the working process depends on its own thermal effect, without additional power consumption.

7. There is no phase change during the spraying process of the insulating liquid heat-conductive coolant. Therefore, the system circulation does not require the gas phase recovery equipment, and only the common filter is needed to filter the impurities generated by the coolant in the relatively open cycle process. Therefore, the system has higher self-adaptability and reliability.

8. Insulating liquid heat-conductive coolant is non-polar substance, which will not affect the electronics, electrical equipment and circuit, and will not cause damage to the hardware.

9. The spray pipes have simple structure and low power consumption, manufacturing technology of the nozzle part is mature and reliable. With simpler heat transfer process and structures, the reliability and controllability thereof are higher.

10. Insulating liquid heat-conductive coolant as a liquid heat exchange method, has generally better heat conduction performance than the case in which forced air convection is used, and compared with traditional forced convection air cooling system which requires fresh air unit and some complex architecture designs, there is less requirements for liquid cooling technology architecture design, and the structure that directly contacts the spray can be simpler, thereby saving costs and extending the service life of the device.

BRIEF DESCRIPTION OF THE DRAWINGS

FIG. 1 is a schematic diagram showing the structure of a coolant contact type cooling system of a high-power device of embodiment I.

DETAILED DESCRIPTION OF THE EMBODIMENTS

The invention will be further described in combination with the drawings and embodiments hereinafter.

The coolant contact type cooling system of a high-power device shown in FIG. 1 comprises a high-power device 1, an insulating liquid heat-conductive coolant 2, nozzles 3, spray branch pipes 4, a spray main pipe 5, a coolant pump 6, a filter 7 and a sealed case body 8.

The sealed case body 8 is a structure having inner and outer layers, a chamber between the inner and outer layers is filled with a heat-superconductive coolant 9, and an outer wall of the outer layer of the sealed case body 8 is provided with heat dissipating fins 10.

The sealed case body 8 is provided with the insulating liquid heat-conductive coolant 2, the coolant pump 6 sinks in the insulating liquid heat-conductive coolant 2, the filter 7 is installed at an inlet of the coolant pump 6, the coolant pump 6 is connected to the spray main pipe 5, and a plurality of spray branch pipes 4 are connected in parallel with the spray main pipe 5, each of the spray branch pipes 4 is provided with a plurality of nozzles 3, and the nozzles 3 face the high-power device 1.

The spray branch pipes 4 and the high-power device 1 are arranged and spaced apart in parallel, the nozzles 3 spray against front and back surfaces of the high-power device 1 to form a relatively open spray structure.

The insulating liquid heat-conductive coolant 2 is a non-polar substance, and the insulating liquid heat-conductive coolant 2 has no phase change during the spraying process.

The insulating liquid heat-conductive coolant 2 is transformer oil, the heat-superconductive coolant 9 is Freon, and the high-power device 1 is IGBT (Insulated Gate Bipolar Transistor).

The filter 7 ensures the purity of the insulating liquid heat-conductive coolant 2, and prevents damage of the impurity to the coolant pump 6 and clogging of the nozzles 3, which improves the self-adaptability and reliability.

The insulating liquid heat-conductive coolant 2 must be a heat-conductive liquid coolant that is highly insulative, such as various types of transformer oil, heat transfer oil, etc., to ensure the insulation of the coolant, and to avoid contact with the high-power device 1 conductive which would otherwise result in damaged device and scrapped system. The insulating liquid heat-conductive coolant 2 generally has a high heat conductivity coefficient, and can be directly contacted with the heat-generating high-power device 1 by spraying for heat dissipation, thereby enabling efficient heat dissipation of the high-power device 1.

The nozzle 3 is necessary to be made of materials with excellent insulation and enough engineering strength.

Heat dissipating fins 10 are disposed outside the sealed casing 8. Heat dissipation of the heat-superconductive coolant 9 relies on the natural convection of the ambient air through the heat dissipating fins 10 and the environment. This cooling method has the outstanding advantages that the cooling section does not use any power consuming appliances or mechanical parts and it can be used as long as the environmental conditions satisfy the basic heat dissipation temperature difference and natural convection conditions. The insulating liquid heat-conductive coolant 2 in the sealed case body 8 is continuously cooled to ensure an effective heat exchange temperature difference between the insulating liquid heat-conductive coolant 2 and the high-power device 1 to effectively cool the high-power device 1.

In the operation method of the coolant contact type cooling system of the high-power device, the coolant pump 6 is started, the insulating liquid heat-conductive coolant 2 passes through the filter 7 into the coolant pump 6, the coolant pump 6 delivers the insulating liquid heat-conductive coolant 2 to the spray main pipe 5, the spray main pipe 5 distributes the insulating liquid heat-conductive coolant 2 to each of the spray branch pipes 4, the insulating liquid heat-conductive coolant 2 sprayed from the nozzles 3 is directly sprayed to the front and back surfaces of the high-power device, heat of the high-power device 1 is carried away by the insulating liquid heat-conductive coolant 2, and the insulating liquid heat-conductive coolant 2 returns to the sealed case body under an action of gravity.

The insulating liquid heat-conductive coolant 2 exchanges heat with the heat-superconductive coolant 9, and the heat-superconductive coolant 9 exchanges heat with the heat dissipating fins 10, and in this cycle, heat of the high-power device 1 is continuously carried away by the insulating liquid heat-conductive coolant 2.

As the heat-superconductive coolant 9, a variety of inorganic and organic heat exchange cooling working materials can be used according to the heat transfer mode (phase change/non-phase change), the coolant filling amount is adjusted based on the heat-conductive working mode (phase change/non-phase), and the vacuum state in the chamber is maintained after the filling is completed.

If the heat-superconductive cycle adopts a phase change circulation mode, that is, the coolant absorbs heat and rapidly vaporizes; the vapor is thermally diffused and continuously flows to the upper end, and condenses into liquid above the chamber (condensing end) and releases heat. Heat is dissipated into the environment through the heat dissipating fins 10 outside of the sealed case body 8, and the condensed liquid flows along the inner wall of the chamber and back to the chamber (evaporation end) to continue to circulate.

The non-phase change cycle mode can also be adopted based on actual heat exchange power, that is, no phase change occurs during the heat conduction process of the coolant, and the heat transfer power is actuated by internal molecular force of the heat superconductive coolant 9 after the heat absorption. Finally, high-efficiency uniformly heat dissipation is achieved by the secondary heat conduction of the heat-superconductive coolant 9, and the insulating liquid heat-conductive coolant 2 in the sealed case body 8 is cooled.

The above disclosed embodiments are merely preferred embodiments of the present invention, and certainly do not limit the scope of the present invention. Therefore, equivalent changes made according to the scope of the present invention for patent application still fall within the scope of the present invention.

What is claimed is:

1. A coolant contact type cooling system of a high-power device, comprising a high-power device, an insulating liquid heat-conductive coolant, nozzles, spray branch pipes, a spray main pipe, a coolant pump, a filter and a sealed case body; wherein
    the sealed case body is a structure having inner and outer layers, a chamber between the inner and outer layers is filled with a heat-superconductive coolant, and an outer wall of the outer layer of the sealed case body is provided with heat dissipating fins;
    the sealed case body is provided with an insulating liquid heat-conductive coolant, the coolant pump sinks in the insulating liquid heat-conductive coolant, the filter is installed at an inlet of the coolant pump, the coolant pump is connected to the spray main pipe, and a plurality of spray branch pipes are connected in parallel with the spray main pipe, each of the spray branch pipes is provided with a plurality of nozzles, and the nozzles face the high-power device;
    the nozzles spray against front and back surfaces of the high-power device to form a relatively open spray structure;
    the insulating liquid heat-conductive coolant is a non-polar substance, and the insulating liquid heat-conductive coolant has no phase change during the spraying process.

2. The coolant contact type cooling system for the high-power device according to claim 1, wherein the spray branch pipes and the high-power device are arranged and spaced apart in parallel in a longitudinal direction.

3. The coolant contact type cooling system for the high-power device according to claim 1, wherein the insulating liquid heat-conductive coolant is transformer oil, heat transfer oil or mineral oil.

4. The coolant contact type cooling system for the high-power device according to claim 1, wherein the heat superconductive coolant is freon, ammonia, alcohol, acetone, water or a dowtherm heat-exchanging agent.

5. The coolant contact type cooling system for the high-power device according to claim 1, wherein the high-power device is an electric vehicle power battery, an electronic chip, a radar transmitter, a data room equipment, a high-power source, IGBT, IEGT, a CPU component, a GPU component, a blade server module or a transformer.

6. An operation method of the coolant contact type cooling system for the high-power device according to claim 1, comprising the following steps: starting coolant pump, wherein when the coolant pump is started, the insulating liquid heat-conductive coolant passes through the filter into the coolant pump, the coolant pump delivers the insulating liquid heat-conductive coolant to the spray main pipe, the spray main pipe distributes the insulating liquid heat-conductive coolant to each of the spray branch pipes, the insulating liquid heat-conductive coolant sprayed from the nozzles is directly sprayed to the front and back surfaces of the high-power device, heat of the high-power device is carried away by the insulating liquid heat-conductive coolant, and the insulating liquid heat-conductive coolant returns to the sealed case body under an action of gravity;

the insulating liquid heat-conductive coolant exchanges heat with the heat-superconductive coolant, and the heat-superconductive coolant exchanges heat with the heat dissipating fins, and in this cycle, heat of the high-power device is continuously carried away by the insulating liquid heat-conductive coolant.

* * * * *